(12) United States Patent
Kwon

(10) Patent No.: US 8,451,056 B2
(45) Date of Patent: May 28, 2013

(54) APPARATUS FOR OUTPUTTING SYMMETRICAL SIGNAL AND AMPLIFIER CIRCUIT

(75) Inventor: Sunwoo Kwon, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 195 days.

(21) Appl. No.: 13/081,622

(22) Filed: Apr. 7, 2011

(65) Prior Publication Data

US 2012/0235743 A1    Sep. 20, 2012

(30) Foreign Application Priority Data

Mar. 15, 2011 (KR) .................. 10-2011-0022802

(51) Int. Cl.
   *H03F 3/217*  (2006.01)
(52) U.S. Cl.
   USPC .......................................... 330/251; 327/296
(58) Field of Classification Search
   USPC ................... 330/207 A, 10, 251; 327/296
   See application file for complete search history.

(56) References Cited

U.S. PATENT DOCUMENTS

| 5,767,740 A | 6/1998 | Fogg |
| 6,605,991 B2 | 8/2003 | Midya et al. |
| 8,013,677 B2 * | 9/2011 | Kaya et al. ................. 330/207 A |

FOREIGN PATENT DOCUMENTS

| JP | 10-126170 | 5/1998 |
| KR | 10-2004-0039310 A | 5/2004 |

* cited by examiner

*Primary Examiner* — Hieu Nguyen
(74) *Attorney, Agent, or Firm* — Sherr & Jiang, PLLC

(57) ABSTRACT

A symmetrical signal generator that includes a first signal part configured to produce a first output pulse signal using a first input pulse signal and a second input pulse signal asymmetrical to each other, and a second signal part configured to produce a second output pulse signal using the first input pulse signal and the second input pulse signal. The second output pulse signal is one inverted to be symmetrical to the first output pulse signal.

11 Claims, 5 Drawing Sheets

APPARATUS FOR OUTPUTTING SYMMETRICAL SIGNAL AND AMPLIFIER CIRCUIT

CROSS-REFERENCE TO RELATED APPLICATIONS

The present application claims priority to Korean Patent Application No. 10-2011-0022802, filed Mar. 15, 2011, which is hereby incorporated by reference in its entirety.

BACKGROUND

As well-known in the art, a class-D amplifier converts an input signal into a pulse width modulation (hereinafter referred to as a PWM) signal having constant amplitude through the power amplification of the input signal. For example, the class-D amplifier is used for power amplification of an audio signal. Such a class-D amplifier operates as binary switches and thus can drastically lessen the loss of a transistor. Further, the class-D amplifier has higher efficiency than a linear amplifier regardless of whether the amplitude of an input signal is large or small.

FIG. 1 is a circuit diagram of a conventional class-D amplifier. As illustrated in FIG. 1, the conventional class-D amplifier includes an operational amplifying unit 10 for operationally amplifying a combined signal obtained by combining a positive input signal $V_{INP}$ and a first feedback signal and a combined signal obtained by combining a negative input signal $V_{INN}$ and a second feedback signal; a positive PWM unit 20 for producing a positive PWM signal $V_{OUTN}$ by comparing a positive output signal from the operational amplifying unit 10 with a reference signal $V_{REF}$; and a negative PWM unit 30 for producing a negative PWM signal $V_{OUTN}$ by comparing a negative output signal from the operational amplifying unit 10 with the reference signal $V_{REF}$. The positive PWM signal $V_{OUTP}$ is provided as the first feedback signal to the operational amplifying unit 10, and the negative PWM signal $V_{OUTN}$ is provided as the second feedback signal to the operational amplifier 10.

The PWM signals $V_{OUTP}$ and $V_{OUTN}$ from this class-D amplifier pass through a low-pass filter including a coil, a capacitor, and the like and employed to drive a load of a loudspeaker and the like.

FIGS. 2A to 2C are views showing an example of an output signal and an input signal from the conventional class-D amplifier, in which FIG. 2A depicts an input signal to the class-D amplifier, FIG. 2B depicts an ideal output signal from the class-D amplifier, and FIG. 2C depicts an actual output signal from the class-D amplifier.

As illustrated in FIGS. 2A to 2C, in view of the output signals from the class-D amplifier, it is ideal for the positive PWM signal $V_{OUTP}$ and the negative PWM signal $V_{OUTN}$ to be symmetrical, i.e., fully differential, as illustrated in FIG. 2B. As illustrated in FIG. 2C, however, the positive PWM signal $V_{OUTP}$ and the negative PWM signal $V_{OUTN}$ represent asymmetrical property in some sections within a pulse period.

The positive PWM signal $V_{OUTP}$ and the negative PWM signal $V_{OUTN}$ having such asymmetrical property are provided as feedback signals to the operational amplifying unit as shown in FIG. 2A. As a result, the amplitude of an input signal to the operational amplifier varies to a relatively large extent, and a DC loop gain and the gain-bandwidth product of the loop gain vary. Moreover, the common mode rejection properties of the operational amplifier may become worse owing to the above.

In order to solve the problems caused by the feedback signal having such asymmetrical property, it may be considered to separately employ a positive operational amplifier for receiving a positive feedback signal and a negative operational amplifier for receiving a negative feedback signal. This potential solution, however, leads to additional power consumption and an increase in size of the amplifier.

SUMMARY

In view of the above, embodiments provide an apparatus for producing symmetrical signal pairs from asymmetrical pulse signal pairs applied thereto.

Embodiments are related to the generation of symmetrical signals, and more particularly, to an apparatus for producing symmetrical pulse signal pairs using asymmetrical pulse signal pairs applied thereto, and an amplifier circuit, which minimizes variations in the input common mode of the amplifier circuit by employing such an apparatus.

Embodiments are related to an amplifier circuit, which minimizes variations in the input common mode of the amplifier circuit by employing such a symmetrical signal generator.

In accordance with embodiments, a symmetrical signal generator that includes at least one of the following: a first signal part configured to produce a first output pulse signal using a first input pulse signal and a second input pulse signal asymmetrical to each other; and a second signal part configured to produce a second output pulse signal using the first input pulse signal and the second input pulse signal, such that the second output signal is inverted to be symmetrical to the first output pulse signal.

In accordance with embodiments, the first signal part and the second signal part may produce the first output pulse signal and the second output pulse signal in synchronization with the first input pulse signal or the second input pulse signal. Also, the first switching pulse signal and the second switching pulse signal may have a common central axis in their pulse widths. Moreover, the first signal part and the second signal part may include a plurality of switching circuits that perform a switching operation by a switching signal derived from the first input pulse signal or the second input pulse signal.

In accordance with embodiments, the first signal part may include a first switching circuit configured to perform a switching operation by a switching signal derived from the first input pulse signal and a second switching circuit configured to perform a switching operation by a switching signal derived from the second input pulse signal. The second signal part includes a third switching signal configured to perform a switching operation by a switching signal derived from the first input pulse signal and a fourth switching circuit configured to perform a switching operation by a switching signal derived from the second input pulse signal.

In accordance with embodiments, the first switching circuit and the third switching circuit may produce signals inverted to each other by the switching signal derived from the first input pulse signal. The second switching circuit and the fourth switching produce output signals inverted to each other by the switching signal derived from the second input pulse signal.

In accordance with embodiments, the first to fourth switching circuits may include first switches for performing a switching operation by the first input pulse signal or the second input pulse signal and second switches configured to perform a switching operation by an inverted signal of the first input pulse signal or the second input pulse signal.

In accordance with embodiments, either the first switches or the second switches may perform a switching operation when in the ON state, while the other performs a switching operation when in the OFF state. Also, either the first switches or the second switches produce a positive signal when in the ON switching state, while the other produces a negative signal when in the ON switching state.

In accordance with embodiments, an amplifier circuit can include at least one of the following: an operational amplifier configured to perform an operational amplification a combined signal obtained by combining an input signal and feedback signals applied thereto; a PWM unit configured to produce a positive PWM signal and a negative PWM signal asymmetrical to each other by comparing an output signal from the operational amplifier with a reference signal; and a symmetrical signal generator being operated by switching signals derived from the positive PWM signal and the negative PWM signal to provide a first pulse signal and a second pulse signal, such that the second output signal has an inverted one from the first output signal and such that the first and the second output signal are used as the feedback signals.

In accordance with embodiments, the symmetrical signal generator is configured to produce the first pulse signal and the second pulse signal in synchronization with the positive PWM signal and the negative PWM signal. Moreover, the symmetrical signal generator can include a first signal part configured to produce the first output pulse signal using the positive PWM signal and the negative PWM signal; and a second signal part configured to produce the second output pulse signal using the positive PWM signal and the negative PWM signal.

In accordance with embodiments, the positive PWM signal and the negative PWM signal may have a common central axis in their pulse widths.

In accordance with embodiments, the first signal part and the second signal part may include a plurality of switching circuits that perform a switching operation by switching signals derived from the positive PWM signal or the negative PWM signal. Moreover, the first signal part may include a first switching circuit configured to perform a switching operation by a switching signal derived from the positive PWM signal and a second switching circuit configured to perform a switching operation by a switching signal derived from the negative PWM signal. The second signal part includes a third switching signal configured to perform a switching operation by a switching signal derived from the positive PWM signal and a fourth switching circuit configured to perform a switching operation by a switching signal derived from the negative PWM signal.

In accordance with embodiments, the first switching circuit and the third switching circuit may produce signals inverted to each other by the switching signal derived from the positive PWM signal. The second switching circuit and the fourth switching circuit produce signals inverted to each other by the switching signal derived from the negative PWM signal. Moreover, either the first switches or the second switches perform a switching operation when in the ON state, while the other performs a switching operation when in the OFF state.

In accordance with embodiments, either the first switch or the second switch produces a positive signal when in the ON switching state, while the other produces a negative signal when in the ON switching state.

In accordance with embodiments, one terminal of the first switches is connected to either one of a positive power supply and a negative power supply, one terminal of the second switches is connected to the other of the positive power supply and negative power supply, and the other terminal of the first switches and the other terminal of the second switches are connected in parallel to the input of the operational amplifier.

In accordance with embodiments, various problems that may arise from the producing of a pair of asymmetrical pulse signals are fundamentally avoided. Moreover, with the amplifier circuit which always provides a pair of symmetrical pulse signals as feedback signals of the operational amplifier circuit, the extent of variation in the amplitude of an input signal of the operational amplifier circuit is not significant, and therefore a DC loop gain and the gain-bandwidth product of the loop gain do not vary. In addition, the common mode rejection properties of the operational amplifier circuit are enhanced accordingly.

In accordance with embodiments, as for the effects comparative to the conventional technology, the design of the operational amplifier circuit becomes easier by the enhancement of DC loop gain and gain-band width product, thereby minimizing power consumption and reducing the structural size of the amplifier circuit as much as possible. In addition, a feedback path is provided for connecting a positive feedback signal and a negative feedback signal to both of positive and negative terminals of the input side of the operational amplifier, thus minimizing the rate of faulty connection of the feedback path.

DRAWINGS

Figure 1:
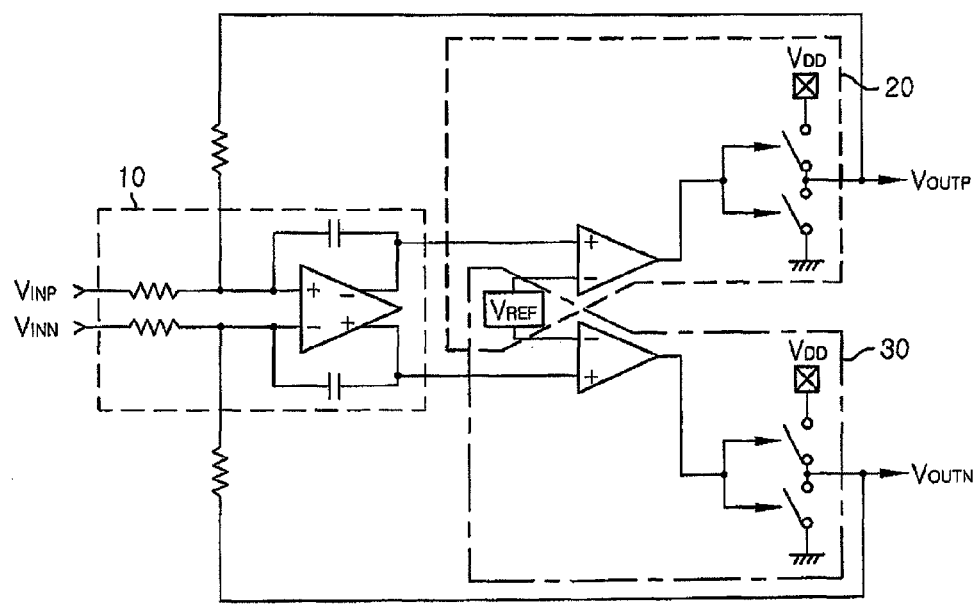
FIG. 1 illustrates a circuit diagram of a conventional class-D amplifier circuit.
Figure 2A:
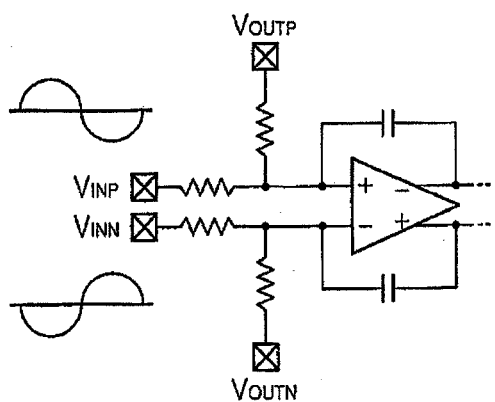
FIGS. 2A to 2C are views illustrating an example of an input signal and an output signal in the conventional class-D amplifier circuit.
Figure 2B:
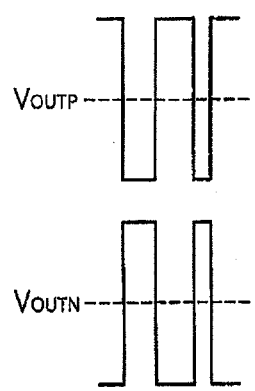
Figure 2C:
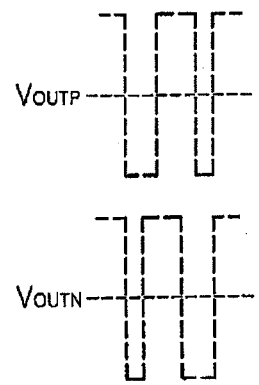
Figure 3A:
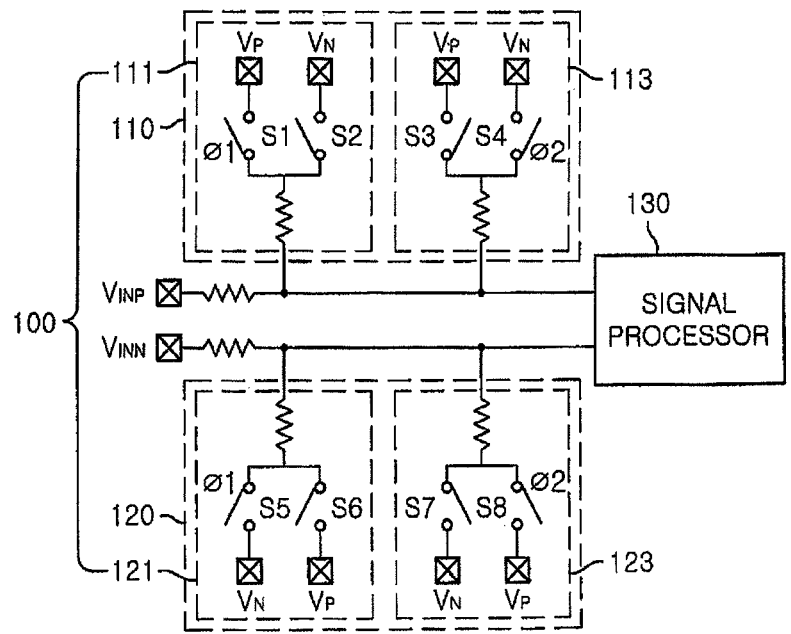
Figure 3B:
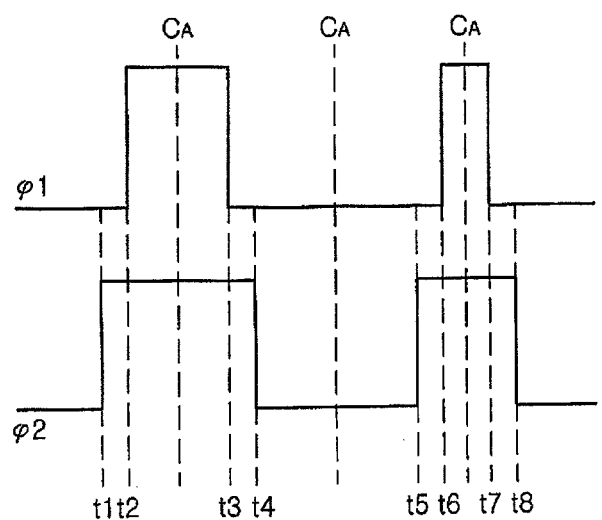
Figure 3C:
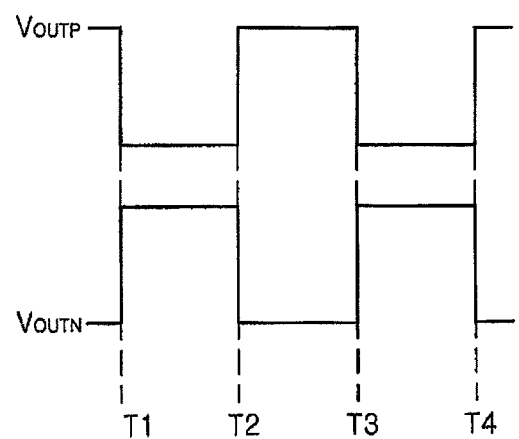

Example FIGS. 3A to 3C illustrate a symmetrical signal generator in detail in accordance with embodiments.

Figure 4:
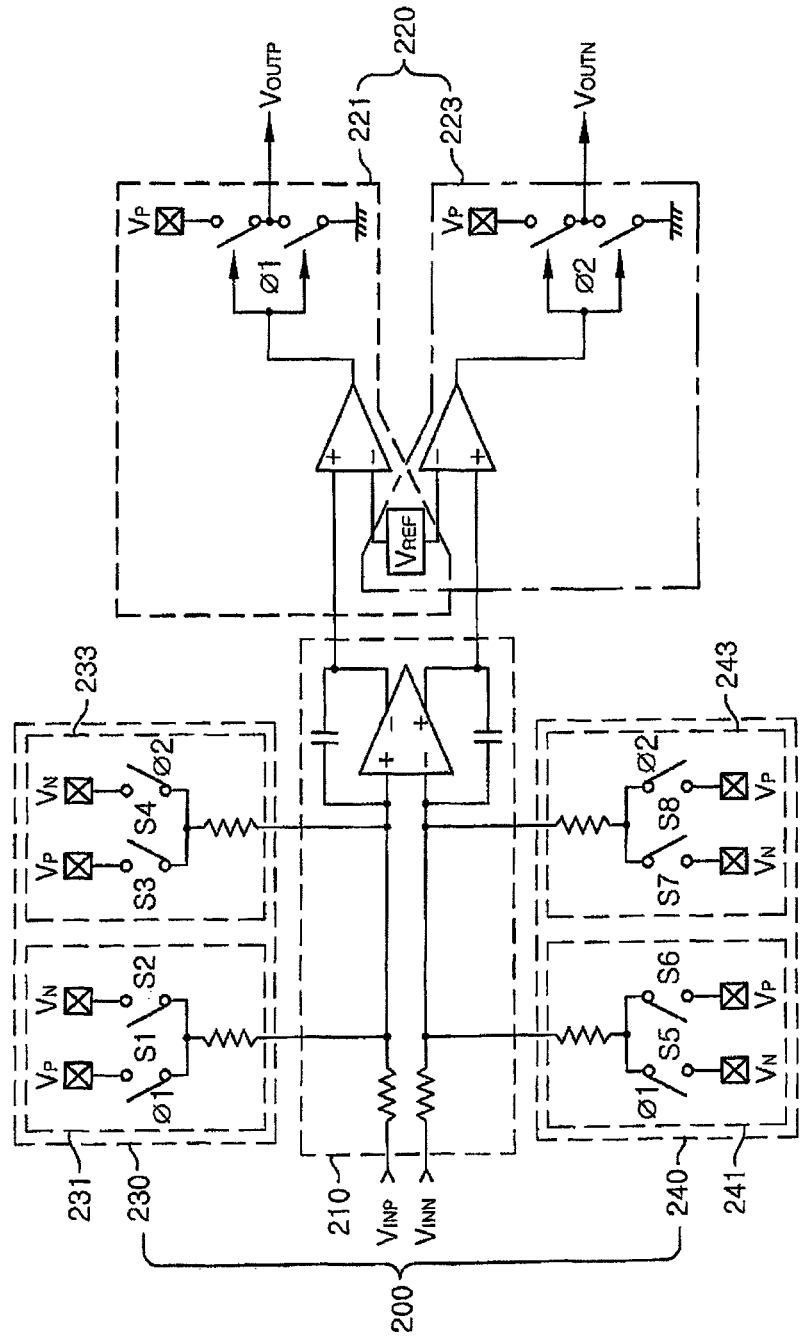

Example FIG. 4 illustrates a circuit diagram of an amplifier circuit in accordance with embodiments.

DESCRIPTION

Embodiments are not limited to those only illustrated and can be implemented in various forms. It should be noted that embodiments are merely provided to make a full disclosure of the invention and also to allow those skilled in the art to know the full range of the invention. Therefore, embodiments are to be defined only by the scope of the appended claims.

In the following description, well-known functions or constitutions will not be described in detail if they would obscure the invention in unnecessary detail. Moreover, the terminologies to be described below are defined in consideration of functions in the present invention and may vary depending on a user's or operator's intention or practice. Thus, the definitions should be understood based on all the contents of the specification.

Example FIG. 3A depicts a symmetrical signal generator 100 in detail while example FIG. 3B depicts input pulse signals to the symmetrical signal generator 100 and example FIG. 3C depicts output pulse signals from the symmetrical signal generator 100.

As illustrated in example FIG. 3A, the symmetrical signal generator 100 includes a first signal part 110 which is operated by a first input pulse signal Φ1 and a second input pulse signal Φ2 asymmetrical to each other to produce a first output pulse signal $V_{OUTP}$; and a second signal part 120 which is operated by the first input pulse signal Φ1 and the second input pulse signal Φ2 to produce a second output pulse signal $V_{OUTN}$ which is inverted one from the first output pulse signal $V_{OUTP}$.

The first signal part 110 and the second signal part 120 produce the first output pulse signal $V_{OUTP}$ and the second output pulse signal $V_{OUTN}$ in synchronization with the first input pulse signal Φ1 and the second input pulse signal Φ2, respectively.

The first and second input pulse signals Φ1 and Φ2 to the first and second signal parts 110 and 120 have a common central axis in their pulse widths. Therefore, the first and second output pulse signals $V_{OUTP}$ and $V_{OUTN}$ from the first and second signal parts 110 and 120 also have a common central axis $C_A$ in their pulse widths accordingly.

The first signal part 110 and the second signal generator 120 may include plural switching networks that perform a switching operation by the first input pulse signal Φ1 or second input pulse signal Φ2.

More specifically, the first signal part 110 includes a first switching circuit 111 that performs a switching operation by a switching signal derived from the first input pulse signal Φ1, and a second switching circuit 113 that performs a switching operation by a switching signal derived from the second input pulse signal Φ2. The second signal part 120 includes a third switching signal 121 that performs a switching operation by a switching signal derived from the first input pulse signal Φ1 and a fourth switching circuit 123 that performs a switching operation by a switching signal derived from the second input pulse signal Φ2.

In this configuration, the first switching circuit 111 and the second switching circuit 121 produce symmetrical signals inverted to each other by the switching signal derived from the first input pulse signal Φ1, and the second switching circuit 113 and the fourth switching circuit 123 produce symmetrical signals inverted to each other by the switching signal derived from the second input pulse signal Φ2.

The first to fourth switching circuits 111, 113, 121, and 123 include first switches S1, S4, S5, and S8 that perform a switching operation by the first input pulse signal Φ1 or second input pulse signal Φ2; and second switches S2, S3, S6, and S7 that perform a switching operation by an inverted signal of the first input pulse signal Φ1 or second input pulse signal Φ2. Here, the second switches S2, S3, S6, and S7 perform a switching operation opposite to that of the first switches S1, S4, S5, and S8.

Table 1 illustrates connection nodes of the first to fourth switching circuits 111, 113, 121, and 123 which are switched by the first input pulse signal Φ1 and second input pulse signal Φ2 applied as the switching signals.

TABLE 1

|  | 1st switching circuit | | 2nd switching circuit | | 3rd switching circuit | | 4th switching circuit | |
| --- | --- | --- | --- | --- | --- | --- | --- | --- |
| Switching Control signal | Φ1 | | Φ2 | | Φ1 | | Φ2 | |
| Logic state | 0 | 1 | 0 | 1 | 0 | 1 | 0 | 1 |
| Connection node | VN | VP | VP | VN | VP | VN | VN | VP |

The switching operations of the first to fourth switching circuits 111, 113, 121, and 123 will be described with respect to the first input pulse signal Φ1 and the second input pulse signal Φ2 by time intervals.

As illustrated in example FIG. 3B, during time intervals, ~t1, t4~t5, t8~, both of the first input pulse signal Φ1 and the second input pulse signal Φ2 have symmetrical sections of logic "0".

As noted from Table 1, during such time intervals, ~t1, t4~t5, t8~, the first switching circuit 111 is connected to a power supply node $V_N$ when the switch S1 is in OFF switching state while the switch S2 is in ON switching state. On the other hand, the third switching circuit 121 is connected to a power supply node $V_P$ when the switch S5 is in OFF switching state and the switch S6 is in ON switching state. The second switching circuit 113 is connected to a power supply node $V_P$ when the switch S4 is in OFF switching state and the switch S3 is in ON switching state. Meanwhile, the fourth switching circuit 123 is connected to a power supply node $V_N$ when the switch S8 is in OFF switching state and the switch S7 is in ON switching state.

During time intervals, t1~t2, t3~t4, t5~t6, t7~t8, the first input pulse signal Φ1 has asymmetrical sections of logic "0" and logic "1."

As noted from Table 1, during these time intervals, t1~t2, t3~t4, t5~t6, t7~t8, the first switching circuit 111 is connected to the power supply node $V_N$ when the switch S1 is in OFF switching state and the inverting switch S2 is in ON switching state. On the other hand, the third switching circuit 121 is connected to the power supply node $V_P$ when the switch S5 is in OFF switching state and the switch S6 is in ON switching state. The second switching circuit 113 is connected to the power supply node $V_N$ when the switch S4 is in ON switching state and the switch S3 is in OFF switching state. Meanwhile, the fourth switching circuit 123 is connected to the power supply node $V_P$ when the switch S8 is in ON switching state and the inverting switch S7 is in OFF switching state.

During time intervals, t2~t3, t6~t7, both of the first input pulse signal Φ1 and the second input pulse signal Φ2 have symmetrical sections of logic "1."

As noted from Table 1, during these time intervals, t2~t3, t6~t7, the first switching circuit 111 is connected to the power supply node $V_P$ when the switch S1 is in ON switching state and the switch S2 is in OFF switching state. On the other hand, the third switching circuit 121 is connected to the power supply node $V_N$ when the switch S5 is in ON and the switch S6 is in OFF switching state. The second switching circuit 113 is connected to the power supply node $V_N$ when the switch S4 is in ON switching state and the switch S3 is in OFF switching state. Meanwhile, the fourth switching circuit 123 is connected to the power supply node $V_P$ when the switch S8 is in ON switching state and the switch S7 is in ON switching state.

As described with respect to the first and second input pulse signals Φ1 and Φ2 by time intervals, the first switch S1 (S4, S5 or S8) and the second switch S2 (S3, S6 or S7) alternatively and repeatedly performs a switching operation between the ON switching state and the OFF switching state. Therefore, between the first switch S1 (S4, S5 or S8) and the second switch S2 (S3, S6 or S7), one outputs a positive signal $V_P$ when in the ON switching state, while the other outputs a negative signal $V_N$ when in the ON switching state.

As illustrated in example FIG. 3C, accordingly, the first signal part 110 and the second signal part 120 produces the first pulse signal $V_{OUTP}$ and the second pulse signal $V_{OUTN}$ having which are fully differential for every time intervals, ~T1, T1~T2, T2~T3, T3~4, T4~.

As illustrated in example FIG. 3B, for example, the first pulse signal $V_{OUTP}$ is combined with a positive pulse signal $V_{INP}$ applied to the signal processor 130, and the second pulse signal $V_{OUTN}$ is combined with a negative pulse signal $V_{INN}$ applied to the signal processor 130. The signal processor 130 performs a signal processing, for example, an operational amplification of the combined signals.

Example FIG. 4 illustrates a circuit diagram of the amplifier circuit employing such an symmetrical signal generator in accordance with embodiments.

As illustrated in example FIG. 4, the amplifier circuit includes an operational amplifier 210 configured to operationally amplify a combined signal obtained by combining an input signal and first and second feedback signals; a PWM unit 220 configured to produce a positive PWM signal $V_{OUTP}$ and a negative PWM signal $V_{OUTN}$ which are asymmetrical to each other by comparing an output signal from the operational amplifier 210 with a reference signal; and a symmetrical signal generator 200 which is operated by switching signals Φ1 and Φ2 derived from the positive PWM signal $V_{OUTP}$ and the negative PWM signal $V_{OUTN}$ to produce a first pulse signal and a second pulse signal which are symmetrical signals, which will then be applied to the operational amplifier 210 as the first and the second feedback signals, respectively.

In the amplifier apparatus illustrated in example FIG. 4, the symmetrical signal generators 230 and 240 are substantially identical to the symmetrical signal generator described with reference to example FIG. 3.

In the amplifier circuit, the symmetrical signal generator 200 produces the first pulse signal and the second pulse signal as the feedback signals in synchronization with the positive PWM signal $V_{OUTP}$ and the negative PWM signal $V_{OUTN}$.

The symmetrical signal generator 200 includes a first signal part 230 which is operated by the positive PWM signal $V_{OUTP}$ and the negative PWM signal $V_{OUTN}$ asymmetrical to each other to output a first pulse signal; and a second signal part 240 which is operated by the positive PWM signal $V_{OUTP}$ and the negative PWM signal $V_{OUTN}$ to output a second pulse signal which is inverted one to be symmetrical to the first pulse signal.

The first switching signal Φ1 and second switching signal Φ2 derived from the positive PWM signal and negative PWM signal provided to the first signal part 230 and second signal part 240, respectively, have a common central axis $C_A$ in their pulse widths as illustrated in example FIG. 3B. Consequently, the first pulse signal and second pulse signal from the first signal part 230 and second signal part 240, respectively, have a common central axis in their pulse widths.

The first signal part 230 and the second generator 240 may include a plurality of switching circuits that perform a switching operation by the first switching signal Φ1 and second switching signal Φ2 derived from the positive PWM signal and negative PWM signal.

For instance, the first signal part 230 includes a first switching circuit 231 that performs a switching operation by the first switching signal Φ1 and a second switching circuit 233 that performs a switching operation by the second switching signal Φ2. The second signal part 240 includes a third switching circuit 241 that performs a switching operation by the first switching signal Φ1 and a fourth switching circuit 243 that performs a switching operation by the second switching signal Φ2.

The first switching circuit 231 and the third switching circuit 241 produces symmetrical signals inverted to each other by the first switching signal Φ1, and the second switching circuit 233 and the fourth switching circuit 243 produce symmetrical inverted to each other by the second switching signal Φ2.

The first to fourth switching circuits 231, 233, 241 and 243 include first switches S1, S4, S5, and S8 that perform a switching operation by the first switching signal Φ1 or second switching signal Φ2; and second switches S2, S3, S6, and S7 that perform a switching operation by the first switching signal Φ1 or second switching signal Φ2.

In the first to fourth switching circuits 231, 233, 241, and 243, one terminal of the first switches S1, S4, S5, and S8 is connected to either a positive power supply $V_P$ or negative power supply $V_N$, one terminal of the second switches S2, S3, S6, and S7 is connected to either the negative power supply $V_N$ or the positive power supply $V_P$, and other terminal of the first switches S1, S4, S5, and S8 and the other terminal of the second switches S2, S3, S6, and S7 are commonly connected in parallel to an input line of the operational amplifier 210 via a resistor.

Therefore, between the first switch S1 (S4, S5 or S8) and the second switch S2 (S3, S6 or S7), one outputs a positive signal $V_P$ when in the ON switching state, and the other outputs a negative signal $V_N$ when in the ON switching state.

Accordingly, as illustrated in example FIG. 3C, the first signal part 230 and the second signal part 240 of the symmetrical signal generator 230 and 240 provide the first pulse signal and the second pulse signal, which are inverted to be symmetrical to each other for every time intervals (~T1, T1~T2, T2~T3, T3~T4, T4~), as feedback signals to the operational amplifier 210.

Then, the operational amplifier 210 performs an operational amplification and outputs a combined signal of the first pulse signal and a positive signal $V_{INP}$ and a composite signal of a second pulse signal and the negative signal $V_{INN}$.

In the amplifier apparatus in accordance with embodiments, the extent of variation in the amplitude of an input signal of the operational amplifier 210 is not significant, and therefore, a DC loop gain and the gain-bandwidth product of the loop gain do not vary. Moreover, the common mode rejection properties of the operational amplifier 210 are improved because of the same reason.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An amplifier circuit comprising:
    an operational amplifier configured to perform an operational amplification a combined signal obtained by combining an input signal and feedback signals applied thereto;
    a PWM unit configured to produce a positive PWM signal and a negative PWM signal asymmetrical to each other by comparing an output signal from the operational amplifier with a reference signal; and
    a symmetrical signal generator operated by switching signals derived from the positive PWM signal and the negative PWM signal to provide a first pulse signal and a second pulse signal,
    wherein the second pulse signal has an inverted one from the first pulse signal and the first pulse signal and the second pulse signal are used as the feedback signals.

2. The amplifier circuit of claim 1, wherein the symmetrical signal generator produces the first pulse signal and the second pulse signal in synchronization with the positive PWM signal and the negative PWM signal.

3. The amplifier circuit of claim 1, wherein the symmetrical signal generator comprises:

a first signal part configured to produce the first output pulse signal using the positive PWM signal and the negative PWM signal; and a second signal part configured to produce the second output pulse signal using the positive PWM signal and the negative PWM signal.

4. The amplifier circuit of claim 1, wherein the positive PWM signal and the negative PWM signal have a common central axis in their pulse widths.

5. The amplifier circuit of claim 1, wherein the first signal part and the second signal part each comprise a plurality of switching circuits that perform a switching operation by switching signals derived from the positive PWM signal or the negative PWM signal.

6. The amplifier circuit of claim 5, wherein:
the first signal part comprises a first switching circuit configured to perform a switching operation by a switching signal derived from the positive PWM signal, and a second switching circuit configured to perform a switching operation by a switching signal derived from the negative PWM signal, and the second signal part comprises a third switching signal configured to perform a switching operation by a switching signal derived from the positive PWM signal and a fourth switching circuit configured to perform a switching operation by a switching signal derived from the negative PWM signal.

7. The amplifier circuit of claim 6, wherein:
the first switching circuit and the second switching circuit produce signals inverted to each other by the switching signal derived from the positive PWM signal, and the second switching circuit and the fourth switching circuit produce signals inverted to each other by the switching signal derived from the negative PWM signal.

8. The amplifier circuit of claim 6, wherein the first, second, third and fourth switching circuits each comprise:
first switches configured to perform a switching operation by the positive PWM signal and the negative PWM signal; and second switches configured to perform a switching operation by an inverted signal of the positive PWM signal and the negative PWM signal.

9. The amplifier circuit of claim 8, wherein one of the first switches and the switches performs a switching operation when in the ON state, while the other performs a switching operation when in the OFF state.

10. The amplifier circuit of claim 8, wherein one of the first switch and the second switch produces a positive signal when in the ON switching state, while the other produces a negative signal when in the ON switching state.

11. The amplifier circuit of claim 10, wherein:
one terminal of the first switches is connected to either one of a positive power supply and a negative power supply;

one terminal of the second switches is connected to the other of the positive power supply and negative power supply; and the other terminal of the first switches and other terminal of the second switches are connected in parallel to the input of the operational amplifier.

* * * * *